(12) United States Patent
Leatham et al.

(10) Patent No.: US 6,312,535 B1
(45) Date of Patent: Nov. 6, 2001

(54) SILICON ALLOYS FOR ELECTRONIC PACKAGING

(75) Inventors: Alan George Leatham, Swansea; Jeffrey Stuart Coombs, Neath; James Burnett Forrest, Swansea; Andrew Josef Widawski Ogilvy, Port Talbot; Robert Ross, Pontardawe; Luis Gerardo Elias, Neath, all of (GB)

(73) Assignee: Osprey Metals Limited, Neath (GB)

( * ) Notice: Subject to any disclaimer, the term of this patent is extended or adjusted under 35 U.S.C. 154(b) by 0 days.

(21) Appl. No.: 09/535,685

(22) Filed: Mar. 27, 2000

Related U.S. Application Data

(63) Continuation-in-part of application No. 08/983,366, filed as application No. PCT/GB96/01730 on Jul. 18, 1996, now abandoned.

(30) Foreign Application Priority Data

Jul. 19, 1995 (GB) .................................................. 9514777

(51) Int. Cl.[7] .......................... C22C 28/00; B22D 23/00; H01L 23/36
(52) U.S. Cl. .............................. 148/442; 164/46; 164/97; 428/614; 148/400
(58) Field of Search ............................... 420/576; 164/97, 164/46; 428/614; 148/442, 400

(56) References Cited

U.S. PATENT DOCUMENTS 5,143,139 * 9/1992 Leatham et al. ........................ 164/46

FOREIGN PATENT DOCUMENTS

5331635 * 12/1993 (JP).
94/11138 * 5/1994 (WO).

OTHER PUBLICATIONS

M.K. Premkumar, W.H. Hunt, Jr., and R.R. Sawtell, Aluminum Composite Materials for Multichip Modules, JOM, Jul. 1992, pp 27–28.*

* cited by examiner

Primary Examiner—Sikyin Ip
(74) Attorney, Agent, or Firm—Brown, Martin, Haller & McClain, LLP

(57) ABSTRACT

A method of producing a silicon based alloy is described which comprises melting a silicon alloy containing greater than 50 wt. % silicon and preferably including aluminium. The melted alloy is then inert gas atomized to produce powder or a spray formed deposit in which the silicon forms a substantially continuous phase made up of fine, randomly oriented crystals in the microstructure. The alloy produced by the method has particularly useful application in electronics packaging materials and a typical example comprises an alloy of 70 wt. % silicon and 30 wt. % aluminium. Such an alloy is an engineering material which, for example, is machinable.

19 Claims, 4 Drawing Sheets

Figure 1:

Chill cast microstructure of Al-70 wt%Si at low magnification.

Chill cast microstructure of Al-70 wt%Si at high magnification.

Spray formed and hot isostatically pressed microstructure of Al-80 wt%Si at low magnification.

Spray formed and hot isostatically pressed microstructure of Al-80 wt%Si at high magnification.

Spray formed and hot isostatically pressed microstructure of
Al-70 wt%Si + 15 vol% SiC MMC.

Spray formed and hot isostatically pressed microstructure of
Al-80 wt%Si + 15 vol% SiC MMC.

US 6,312,535 B1

SILICON ALLOYS FOR ELECTRONIC PACKAGING

CROSS REFERENCE TO RELATED APPLICATIONS

This application is a Continuation-In-Part of U.S. application Ser. No. 08/983,366 filed Feb. 18, 1998, now abandoned, which is a 371 of PCT/GB96/01730 filed Jul. 18, 1996.

BACKGROUND OF THE INVENTION

This invention relates to silicon-aluminum alloys and also includes a microelectronic packaging material comprising an alloy as aforesaid.

Information Processing is typically achieved by semiconductors (e.g. silicon or gallium arsenide) that are interconnected, powered, cooled and protected by "packaging". The materials used in the packages, and onto which the electronic devices are mounted and enclosed, include a wide range of low cost plastics, as well as common metals and alloys (e.g. Al, Cu, Ti). However, for demanding applications (high power/high frequency), more sophisticated alloys, composites or ceramics are increasingly being specified. For example, as the density of circuitry gradually increases, the amount of heat generated also increases and, therefore one critical function of the packaging material is to dissipate the heat from the electronic devices, otherwise their efficiency deteriorates and their "life" is reduced. Furthermore, thermal mis-match between the electronic components and the heat sink to which they are attached must be minimized in order to prevent stressing and subsequent failure of the brittle electronic devices and/or solder joint connections. Consequently, package materials which exhibit low and controlled coefficients of thermal expansion (CTE), combined with high thermal conductivity, are essential. An additional requirement for many defence, aerospace and space applications is the minimisation of weight.

Pure aluminium and conventional aluminium alloys have been popular as electronic packaging materials for the dissipation of heat due to their high thermal conductivities in the range 200–235 W/mK. However, with the higher levels of integration used in multi-chip modules and microwave integrated circuits there are demands that cannot be satisfied by aluminium packages. Namely, the thermal expansion mismatch caused by the high CTE of these materials which are in the range 22–24 ppm/° C., (compared to gallium arsenide and silicon which have CTE volumes of approximately 6 ppm/° C. and 3 ppm/° C. respectively).

Other materials such as an 54% Fe-29%Ni-17%Co alloy, also known as KOVAR (a Registered Trade Mark of The Carpenter Technology Corporation), with a CTE of 5.8 ppm/° C. reduce the thermal expansion mismatch with semi-conductor materials. However, KOVAR has a low thermal conductivity (15–17 W/mK), a high density (8.2 g/cc) and an inadequate specific stiffness (17 GPa.cm$^3$/$_g$). Thus, KOVAR is not the optimum material for efficient thermal management.

Refractory metals such as molybdenum and tungsten have both high thermal conductivity and low CTE values. These metals are normally mixed with copper to form W—Cu and Mo—Cu composites which can be machined. However both these composites have a high density, and therefore there is a weight penalty.

Weight considerations are particularly important in avionics and space applications. One method of producing lightweight electronic packaging materials combined with high thermal conductivities and low CTEs is via aluminium metal matrix composites (JOM, July 1992, p.24–28). Particulate silicon carbide is a common ceramic reinforcement due to its low coefficient of thermal expansion, high thermal conductivity, and low cost, compared to other ceramic particulates such as aluminium nitride. However, silicon carbide loadings in the range 65–75 vol % are required to obtain aluminium metal matrix composites with the low CTE required for electronic packaging.

Methods for the manufacture of Al/SiC metal matrix composites (MMC) can be classified as follows:

(i) liquid state processes in which the ceramic particulate is added to the molten matrix alloy, agitated to prevent SiC settling due to density differences, and cast to shape. However, this method is limited to SiC levels up to 30 vol %, because of problems with fluidity, and to certain aluminium alloy matrices which do not react with SiC to form aluminium carbide which is detrimental to mechanical properties and corrosion resistance.

(ii) solid state processes in which the matrix alloy is blended with ceramic particulate and pressed. In a practical sense these processes are limited to SiC reinforcements of approximately 40 vol % placing a limit on the CTE reduction available.

(iii) infiltration processes in which a green SiC compact is infiltrated with the molten matrix alloy. Very high SiC particle loadings can be achieved by infiltration processes (up to 75 vol %). Since the SiC—Al is nonwetting, infiltration is assisted using pressure or by conditioning the SiC particle surfaces to assist infiltration by capillary action. Whilst successful in achieving the SiC loading required for CTE matching with semiconductor materials, the metal matrix composites are extremely difficult to machine. In addition, Al/SiC MMC is also difficult to metallize, to join, and can be prone to gas leakage at the high vacuums required for certain applications.

(iv) another route is spray forming, in which an aluminium-based alloy is melted and inert gas atomized and ceramic particulate is injected into the metal spray which co-deposits to form a metal matrix composite. However, it is not possible to introduce the required high loading of SiC (65–75 vol %) by this method. Such attempts have resulted in excessive porosity, particle clumping, and poor SiC loading reproducibility.

Another method for the production of aluminium alloys with a low coefficient of expansion is spray forming of hypereutectic aluminium-silicon alloys. Instead of introducing an exogenous reinforcing ceramic phase or phases in the form of particulate or fibres, the reinforcing phase, silicon, is formed 'in-situ' by nucleation and growth from the liquid during solidification of the spray formed deposit. The advantage of this method is that the endogeneous reinforcing phase, silicon, is in perfect atomic contact with the aluminium matrix because the solid-state phases which constitute the alloy are derived from the same source, namely, the alloy in the liquid state. We have spray formed Al—Si alloys with silicon contents up to 50 wt %. For example, we published a paper in the Second International Conference on Spray Forming in 1993 relating to such alloys where the main objective was to produce Al—Si alloys up to 50 wt %. for thixoforging, (i.e. forging in the semi-solid state to form structural wear-resistant products).

Also our U.S. Pat. No. 5,143,139 discloses the spray forming of Al-20Si alloys. However, it was found that it was not possible to hot work materials containing more than 35% silicon.

In EP-A-411577, there is disclosed a method of producing aluminium based alloys containing silicon where aluminium silicon alloys with up to 15 wt % Si are melted and fine silicon powder, preferably not more that 10 μm mean particle size, is injected as particulate to produce spray formed deposits with total silicon contents up to 55 wt %. According to the first aspect of that invention, "silicon which is soluble in aluminium is deliberately sprayed in the form of solid particles and mixed into the aluminium alloy. Thus it is possible to produce an aluminium based alloy having a high content of silicon without increasing the melting temperature of the aluminium alloy." An example given was the preparation, melting and spraying of an aluminium alloy containing 15 wt % silicon and the simultaneous deposition of silicon particles of 3 μm mean particle size in amounts that would result in total silicon contents of 35 wt %, 45 wt % and 55 wt %. The pouring temperature of the Al-15 wt % Si alloy was quoted at 650° C.

We have found that the injection of fine particulate at such high volume fractions leads to:
  (a) inhomogeneous distribution of the injected phase in the matrix,
  (b) excessive porosity,
  (c) high oxide content (because of the use of fine powder which has a large surface area), and
  (d) low yields (because the fine particulate is carried away with the atomizing gas).

Accordingly, we believe such a method is impracticable.

Another prior proposal is contained in WO94/11138 which discloses a silicon-based alloy where an alloy is rapidly solidified into powder by atomisation or by melt spinning and milling prior to hot isostatically pressing. Because of the large difference in melting points between silicon and aluminium, the final formed product will have discrete silicon "islands" within an aluminium matrix.

Figure 2:
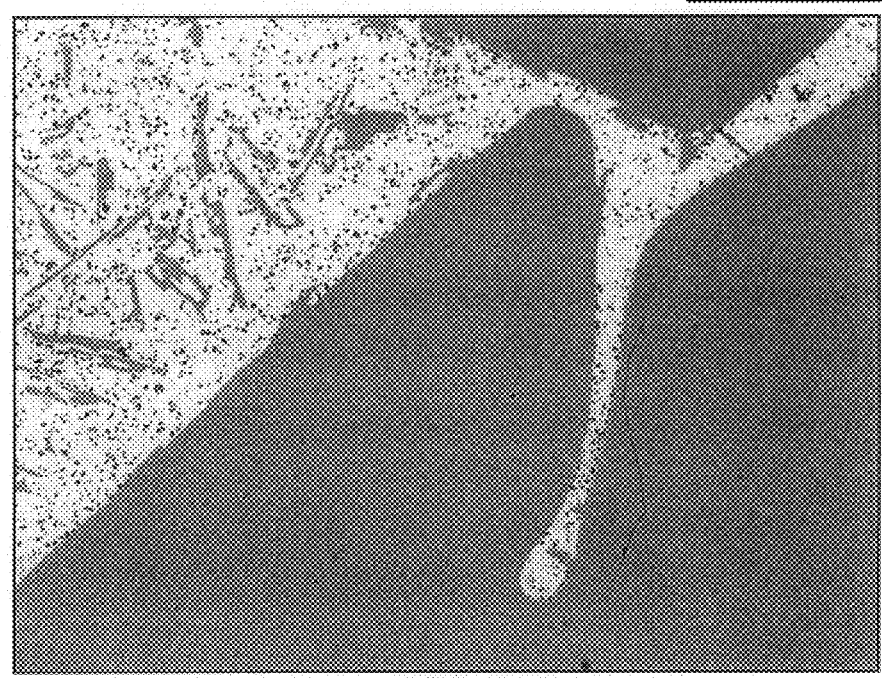

It is also known that silicon-aluminium alloys can be produced by melting and casting, see for example, the German article "Gefuge und thermische Volumen änderungen von Al—Si-Liegierunger" of Chanyuang Gan and Erhard Hornbogen. However, in the compositional range of interest (51–90 wt %) the as-cast microstructure is characterized by mainly large, discrete, faceted, high aspect ratio primary silicon crystals which impair mechanical properties and machinability. For example, in FIGS. 1 and 2 of this application there is shown the microstructure of chill cast Al70% Si. Primary silicon crystals appear black against the light grey Al—Si eutectic constituent. The primary silicon particle size, which appear as single acicular crystals, is of the order of millimetres which results in a very anisotropic microstructure. This makes it quite unsuitable for the application to electronic packaging. For example, the walls and bases of the enclosures which go to make up electronic packages are typically 1–3 mm thick and, therefore, with a chill cast material it would be possible to have one single silicon crystal passing through the base or side walls of the package. This would make the material extremely difficult to machine to the fine surface finishes required for metallization, because the silicon crystal would be susceptible to fracture in a single direction along a preferred crystallographic plane. In addition, because of the large silicon crystal size, the local CTE and thermal conductivity of the material may vary widely depending upon whether aluminium or silicon is in contact with the chip or chip carrier. It is generally considered that these alloys have no engineering applications and are only used as masteralloys for liquid metal processing industries or steel de-oxidation.

SUMMARY OF THE PRESENT INVENTION

In accordance with our invention, we are proposing processing using a silicon-based alloy by inert gas atomization to form a spray-formed deposit.

Therefore, according to the present invention, a method of producing a silicon-aluminium alloy comprises the steps of melting a silicon-aluminium alloy containing greater than 50 wt % Si, inert gas atomizing said alloy into a spray in which silicon crystal growth begins during atomized droplet flight, collecting the spray as a coherent deposit, and effecting controlled cooling and solidification of the deposit whereby the silicon and aluminium form substantially continuous phases within the matrix, the silicon phase consisting of fine, randomly oriented crystals in the microstructure of the alloy material.

In the material of the invention the coefficient of thermal expansion of the deposit is in the range 4.5–11 ppm/Kg, thermal conductivity is greater than 100 W/m° K., the density is less than 2.6 g/cm$^3$ and the material can be readily machined and plated.

Figure 3:
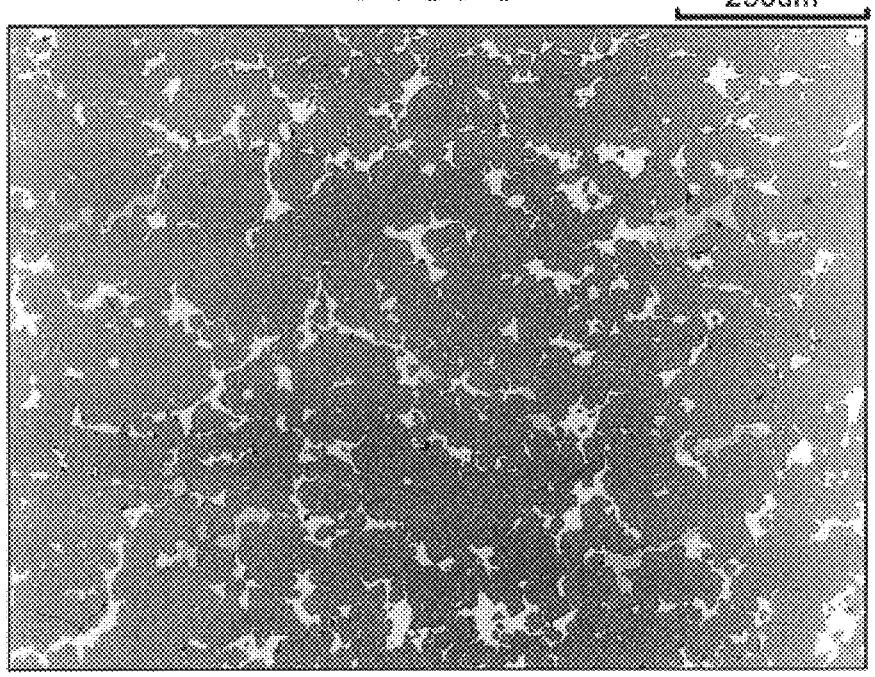
Figure 4:
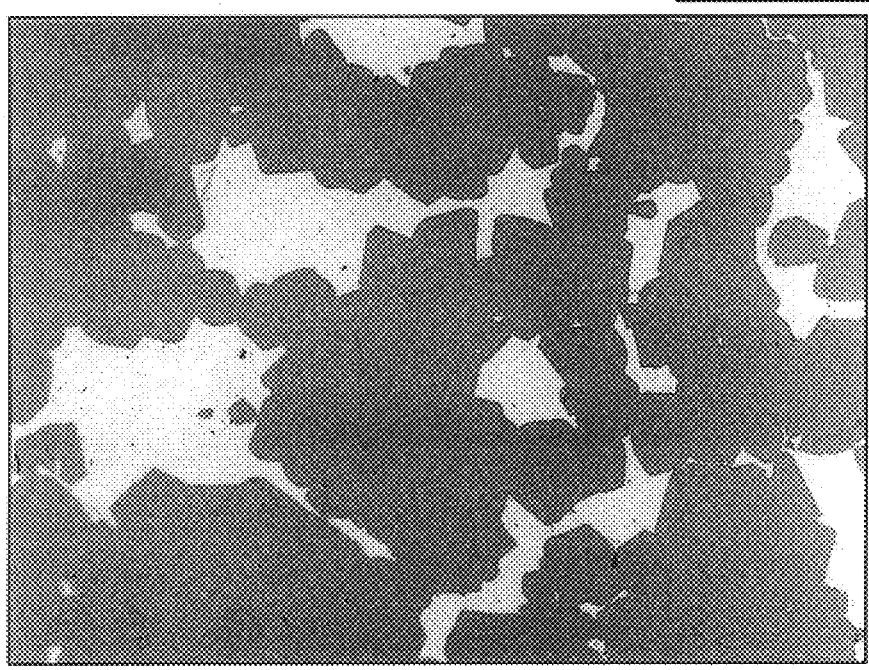

There is a large temperature difference between the commencement of the solidification of the silicon phase (at temperatures up to 1410° C.) and the final solidification of an aluminium-silicon eutectic phase (at approximately 580° C.). For this reason, the microstructure of the fully solidified product is controlled by both solidification in flight and after deposition. The rapid solidification of primary silicon which occurs during flight and on the point of deposition provides fine silicon nuclei and a fine crystal microstructure onto which further silicon solidification occurs after deposition. This subsequent solidification allows the individual silicon crystals to grow together to form a continuous network (or skeleton) of silicon surrounded by aluminium-silicon liquid. By controlling the solidification of this remaining liquid it is possible to generate a substantially dense spray formed product with continuous networks of both silicon and aluminium phases. Because of the method of production, (i.e. rapid solidification in flight plus nucleation on deposition) the silicon phase is polycrystalline and therefore not as fragile as a cast product. In addition, the fracture path is limited by the thickness of the network "arms", being typically less than 50–100 microns (measured using the mean linear intercept method). Furthermore, the continuous silicon network provides a rigid, thermally stable product with a low CTE. The surrounding aluminium phase is also a continuous network which imparts toughness to the alloy and also provides a continuous path for heat conduction, thereby providing a high thermal conductivity material. For most electronic packaging applications, it is preferred that the silicon content be greater than 60%. FIGS. 3 and 4 illustrate spray formed Al80% Si, the dark grey constituent is silicon and the white constituent is aluminium. The substantially continuous phases of the silicon and aluminium can be clearly seen. The low coefficient of expansion and low ductility phase, silicon, being held together by the ductile and high thermally conductivity phase, aluminium. If required, the alloy can be hot isostatically pressed to remove any residual porosity in the semi-solid or solid condition.

Figure 5:
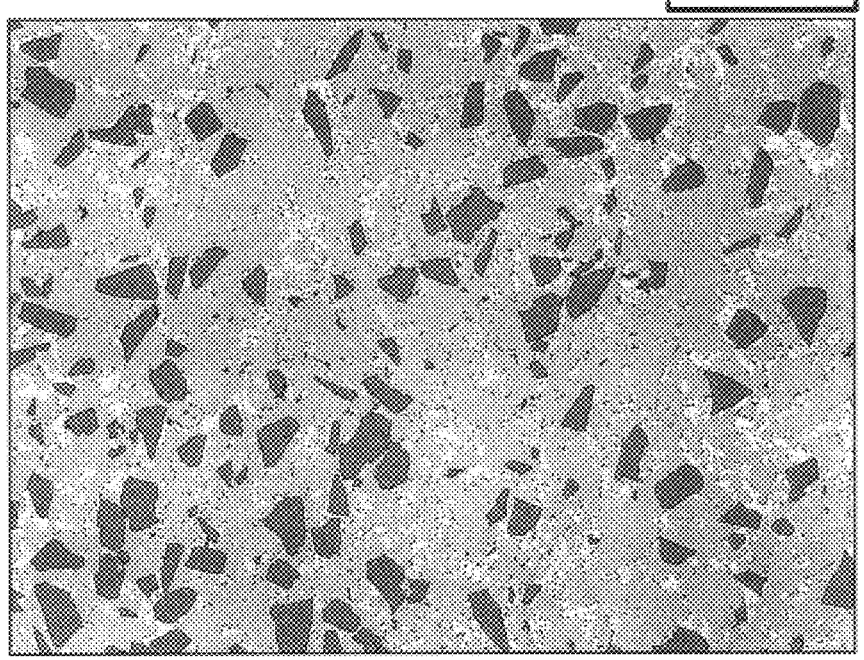
Figure 6:
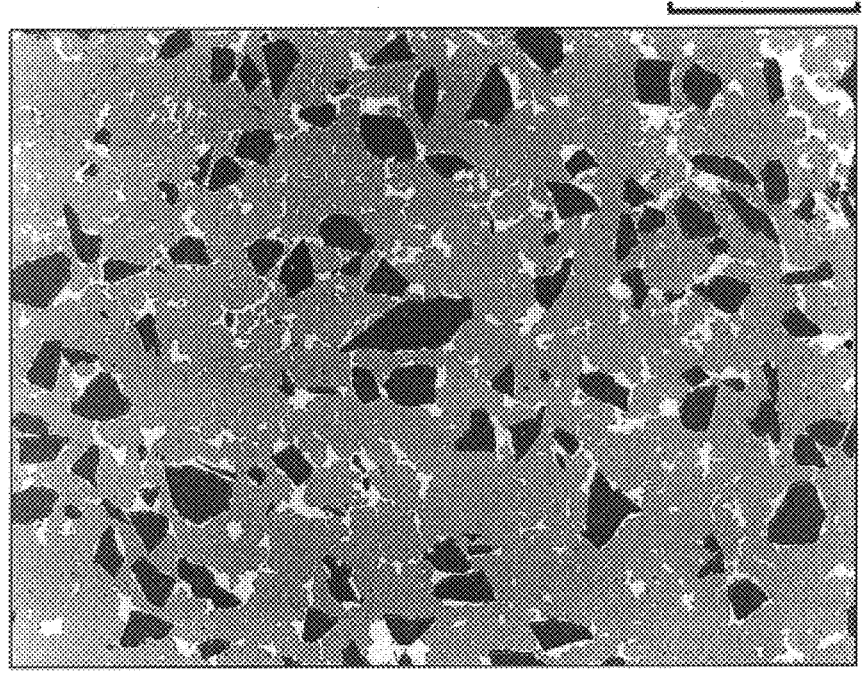

In a variation of the invention, ceramic particles may be introduced into the atomizing spray. FIGS. 5 and 6 illustrate spray formed and hipped Al-70 wt % Si and Al-80 wt % Si with approximately 15 wt % addition of 9 μm SiC, the white constituent is aluminium, the light grey constituent is silicon, and the darker constituent is silicon carbide particulate. The ceramic particles are preferably injected into the spray.

If the alloy material includes ceramic particulate additions, such as silicon carbide, up to 35 vol % the metal matrix composite material may be encapsulated, evacuated, and hot isostatically pressed in the semi-solid or solid condition.

In accordance with another aspect of the present invention, there is provided an alloy comprising:

50–90 wt % Si
10–50 wt % Al
0–10 wt % other alloying additions wherein the silicon and aluminium form substantially continuous phases, the silicon phase is made up of randomly oriented, fine crystals of silicon in the microstructure of the alloy material; the coefficient of thermal expansion is in the range of 4.5–11 ppm/K; and the thermal conductivity is greater than 100 W/mK. The other alloy additions are deliberately added and exclude trace elements. The additions may include:

Magnesium—up to 2 wt %—for refining the silicon phase.
Copper—up to 5 wt %—forming a tertiary phase with a low coefficient of thermal expansion.
Iron—up to 8 wt %—forming a tertiary phase with a low coefficient of thermal expansion.
Zirconium—up to 0.5 wt %—for strengthening the aluminium matrix.

The additions may also include any alloy addition conventionally added to aluminium alloys and specifically aluminium silicon alloys.

If desired, the alloy material may contain ceramic particulate, such as SiC up to 35 vol. The maximum value of thermal conductivity that could be achieved would depend upon the reinforcing particulate e.g. aluminium-nitride or diamond.

The invention also includes a microelectronic packaging material comprising an alloy as aforesaid. The alloy material is normally cut and machined into a packaging component of desired configuration or it may be semi-solid formed. In addition to electronic applications, the alloys can also be used for structural applications where there is a requirement to match the CTE with other materials and to reduce weight. Rapidly moving robotic components are another potential application.

Figures 7A, 7B:
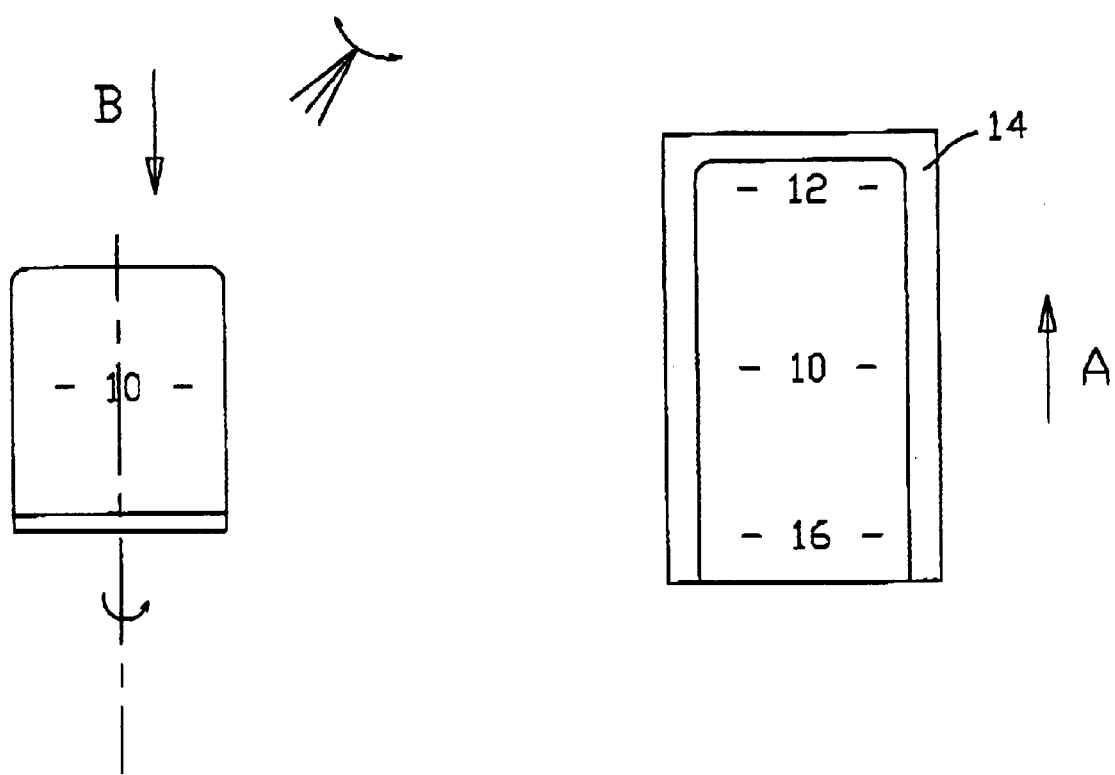

FIGS. 7a and 7b illustrate diagrammatically the controlled cooling of the present invention particularly after deposition has been completed. In these figures the silicon-aluminium alloy is sprayed to form a deposit 10. However, although the deposit forms a solidified skin, much of the aluminium within the deposit remains molten for a prolonged period of time after deposition because of the large difference between the melting temperatures of aluminium and silicon. In order to control the cooling so that the solidification is effected in a direction A the last deposited material 12 is insulated by means of insulation 14 and, if desired, the first deposited material 16 may be cooled more quickly by force cooling. Only by controlling the cooling can the aluminium phase solidify directionally within and around the already solidified silicon skeleton and any shrinkage porosity can be concentrated at the top of the billet and therefore easily removed. An additional step that can be taken is to inject solid particles of the alloy into the spray during deposition which helps promote cooling of the centre of the deposit.

The innovative distinctions of the present invention stem from the fact that the main constituent is silicon as a substantially continuous and thermally stable phase with aluminium as the substantially continuous and ductile alloying element. By atomizing the silicon alloy, silicon crystal growth begins during atomized droplet flight and, in the deposit, a large number of nucleative sites are created which grow and impinge into one another to form a network structure in which silicon crystals are randomly oriented and not discrete and highly orientated as in a cast structure and therefore present a substantiality continuous phase making the deposit structurally coherent and capable of being machined to fine surface finishes.

Advantages of the alloy materials of the present invention are that they are machinable with conventional carbide tools, are weldable, brazable and platable with materials such as nickel or gold because both the Al and Si phases are electrically conductive (unlike AlSiC MMC).

Property data of one alloy developed for electronic packaging is given in Table 1, below. Tables 2 and 3 provide a selective comparison between the alloy materials of the present invention and a wide range of semiconductor and other materials used in the electronics industry. These details have been published on Nov. 17, 1995, under European Community Project No. BRE2-CT2-0146.

TABLE 1

Selected Properties of 70 Si 30 Al %
Electronics Packaging Materials

| PROPERTY | | 70 Si 30 Al % Packaging Material |
|---|---|---|
| Coefficient of thermal expansion | ppm/K | 6.8 ppm/K (0–500° C.) |
| Thermal conductivity | $Wm^{-1}K^{-1}$ | 120 |
| Specific heat | $Jkg^{-1}K^{-1}$ | 850 |
| Ultimate tensile strength | MPa | 130 |
| Young's modulus | GPa | 130 |
| Density | gm/cc | 2.5 |
| Porosity | | <0.1% not connected |
| Surface Resistivity | $\mu\Omega.cm$ | 80–150 |
| Proven machining methods | | Alloy can be machined using carbide tools, polycrystalline diamond tools, laser and EDM |

TABLE 2

Selected Properties of Electronic Materials, Substrates and Packaging

| Material | Thermal Conducivity $WM^{-1}K^{-1}$ | Thermal Expansion $10^{-6}K^{-1}$ | Density g/cc | Composition |
|---|---|---|---|---|
| GaAs | 42 | 6.5 | 5.3 | GaAs |
| Si | 84 | 3 | 2.33 | Si |
| Alumina | 33 | 6.7 | 3.8 | $Al_2O_3$ |
| Aluminium Nitride | 165 | 5.3 | 3.3 | AlN |
| Beryllia | 260 | 7.6 | 2.9 | BeO |
| Al-SiC MMCs | 160 (typical) | 7 | 3 | Al-70 SiC (typical) |
| Aluminium | 201 | 23.2 | 2.7 | Al |
| Copper-tungstens | 160 | 7.6 | 1.7 | 80 W-20 Cu (typical) |
| Titanium | 22 | 9.5 | 4.5 | Ti |
| Kovar | 16.7 | 6 | 8.2 | 54 Fe-29 Ni-17 Co |
| Copper | 385 | 16.1 | 8.9 | Cu |
| 70 Si/30 Al | 120 | 6.8 | 2.5 | Al-Si |

TABLE 3

Comparison Between Si/Al alloys and Other Current Packaging Materials

| Characteristic | Si/Al | AlSiC MMC MMCs | Kovar | Ti | Cu—W | Al₂O₃ | AIN |
|---|---|---|---|---|---|---|---|
| Expansion match to GaAs | Yes | Yes | Yes | Poor | Yes | Yes | Yes |
| Expansion match to silicon | Near | No | Near | No | No | No | Near |
| Thermal conductivity | High | High | Very low | Very low | High | Low | High |
| Machinability | Good by all conventional methods | Poor- diamond and EDM only | Good by all conventional methods | Good by all conventional methods | Reasonable | Poor - Diamond only | Poor - Diamond only |
| Density | very low | Low | High | Medium | Very high | Medium | Low |
| Plating | Medium | Difficult | Easy | Difficult | Difficult | Difficult | Difficult |
| Cost | Medium | Medium | Medium | High | High | Low | High |

There are now described six examples of suitable alloy compositions each of which may be spray formed in accordance with the disclosure in our European Patent No. 0225732B, the contents of which are incorporated herein by reference. The spray conditions in the first four examples are suitably:

Atomizing gas—Nitrogen
Gas to Metal ratio—4 m³/kg
Spray Distance—700 mm
The billet size is suitably 10 kg of 150 mm diameter.

EXAMPLE 1

80 wt % Si
20 wt % Al.

The CTE of this alloy is 4.8 ppm/° C. and the thermal conductivity at 120 W/m° K. is slightly lower than Example 2, but the material can be more easily machined by component manufacturers.

EXAMPLE 1

70 wt % Si
30 wt % Al with 15 vol % addition of SiC.

This has a CTE of 6.22 ppm/° C. and thermal conductivity of 120 W/m° K.

EXAMPLE 3

70 wt % Si
30 wt % Al
CTE of 6.8 ppm/° C.
Thermal conductivity of 140 W/m° K.

In the final two example the spray conditions are slightly different.

|  | Example 4 | Example 5 |
|---|---|---|
| Composition | Al 60 Si | Al 70 Si |
| Pouring Temp ° C. | 1270 | 1420 |
| Metal Flowrate (kg/min) | 8.3 | 9.6 |
| Gas:Metal ratio (m³/kg) | 2.8 | 2.5 |
| Spray Height (mm) | 700 | 890 |
| Billet diameter (mm) | 170 | 220 |
| Billet height (mm) | 640 | 570 |
| CTE (ppm/° C.) | 9.1 | 6.8 |
| Thermal conductivity (W/mK) | 130 | 120 |

Table 3 below shows the coefficient of thermal expansion and thermal conductivity values for different silicon contents of aluminium silicon alloys.

| Si % | W/mK Conductivity | CTE ppm/° C. |
|---|---|---|
| 50 | 140 | 10.5 |
| 60 | 130 | 9.1 |
| 70 | 120 | 0.8 |
| 80 | 120 | 4.8 |

What is claimed is:

1. A method of producing silicon aluminum alloy deposits comprising the steps of:
   (a) melting a silicon aluminum alloy containing greater than 50 wt % Si;
   (b) inert gas atomizing said alloy into a spray in which silicon crystal growth begins during atomized droplet flight;
   (c) collecting the spray as a deposit;
   (d) effecting rapid solidification of the silicon phase during the deposition process to form a substantially continuous network of solid silicon made up of fine randomly oriented crystals surrounded by a liquid phase which is predominantly aluminum;
   (e) holding said deposit above the melting temperature of the aluminum liquid phase; and
   (f) effecting directional solidification of the aluminum liquid phase by conduction through the formed deposit to concentrate any shrinkage porosity at a preferred portion of the deposit whereby the deposit comprises a continuous network of silicon supported by a ductile, thermally conductive, continuous network of aluminum, the coefficient of thermal expansion of the total deposit being in the range of 4.5–11 ppm/° k. and the thermal conductivity of the total deposit being greater than 100 W/m° k.

2. A method according to claim 1, wherein the directional solidification of the aluminum liquid phase comprises creating a temperature gradient in the deposit whereby solidification is from first deposited material towards last deposited material to form a substantially continuous phase of aluminum.

3. The method according to claim 1, including the further step of introducing metallic particles.

4. A method according to claim 1, comprising the additional step of introducing solid particles of the alloy or similar composition alloy into the spray during deposition to promote cooling of the centre of the deposit.

5. A method according to claim 1, comprising melting a silicon alloy containing greater than 60 wt % Si.

6. A method according to claim 1 or 5, wherein the silicon network thickness is less than 200 micron.

7. A method according to claim 6, wherein the silicon network thickness is less than 100 micron.

8. A method according to claim 1, comprising deliberately adding alloy additions selected from 2 wt % Magnesium, up to 5 wt % Copper, up to 8 wt % Iron, up to 0.5 wt % Zirconium.

9. A method according to claim 1, comprising the further step of introducing ceramic particles.

10. A method according to claim 8, comprising introducing silicon carbide particles.

11. A method according to claim 10, wherein the silicon carbide particles are introduced by injection into the spray during spray deposition of the silicon alloy.

12. A method according to claim 1, wherein a proportion of the silicon phase is solidified rapidly in flight and on deposition and the remainder of the silicon and aluminum phase is cooled and solidified more slowly by conduction through the formed deposit, said cooling being controlled and directional whereby solidification is in a direction from first deposited material towards last deposited material to form a substantially continuous phase of aluminum.

13. An alloy produced in accordance with the method of claim 1, comprising 51–90 wt % Silicon, 10–50 wt % Aluminum, 0–10 wt % other alloying additions, wherein the silicon forms a substantially continuous phase made up of randomly oriented fine crystals of the silicon in the microstructure of the alloy material;

the aluminum forms a substantially continuous phase of ductile material within and about the continuous phase of silicon;

the coefficient of thermal expansion is in the range 4.5–11 ppm/° k.; and the thermal conductivity is greater than 100 W/m° K.

14. An alloy according to claim 13, wherein the other alloying additions deliberately added to the alloy are selected from up to 2 wt % Magnesium, up to 5 wt % Copper, up to 8 wt % Iron, up to 0.5 wt % Zirconium.

15. An alloy according to claim 13 or 14, wherein the alloy material contains ceramic particulate.

16. An alloy according to claim 15, wherein the ceramic particulate comprises up to 35 vol % Silicon Carbide.

17. An alloy according to claim 13, wherein the alloy comprises 70 wt % Silicon and 30 wt % Aluminium.

18. An alloy according to claim 13, wherein the alloy comprises 55 wt % Silicon and 45 wt % Aluminium.

19. An alloy according to claim 13, machined to form a microelectronic packaging material.

* * * * *